(12) United States Patent
Hsieh et al.

(10) Patent No.: US 10,141,416 B2
(45) Date of Patent: *Nov. 27, 2018

(54) SEMICONDUCTOR STRUCTURE WITH ENLARGED GATE ELECTRODE STRUCTURE AND METHOD FOR FORMING THE SAME

(71) Applicant: Taiwan Semiconductor Manufacturing Co., Ltd., Hsinchu (TW)

(72) Inventors: Bo-Wen Hsieh, Miaoli County (TW); Wen-Jia Hsieh, Changhua County (TW); Yi-Chun Lo, Hsinchu County (TW); Mi-Hua Lin, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/687,308

(22) Filed: Aug. 25, 2017

(65) Prior Publication Data

US 2017/0358653 A1 Dec. 14, 2017

Related U.S. Application Data

(63) Continuation of application No. 14/927,842, filed on Oct. 30, 2015, now Pat. No. 9,748,350.

(51) Int. Cl.
*H01L 29/423* (2006.01)
*H01L 29/66* (2006.01)
*H01L 29/78* (2006.01)
*H01L 29/40* (2006.01)
*H01L 29/49* (2006.01)

(52) U.S. Cl.
CPC ...... *H01L 29/42376* (2013.01); *H01L 29/401* (2013.01); *H01L 29/4966* (2013.01); *H01L 29/66545* (2013.01); *H01L 29/66795* (2013.01); *H01L 29/785* (2013.01); *H01L 29/7848* (2013.01); *H01L 29/7851* (2013.01)

(58) Field of Classification Search
CPC ........ H01L 29/495–29/4975; H01L 29/66545; H01L 21/76841; H01L 21/76843; H01L 21/76846; H01L 23/53223; H01L 23/53238; H01L 23/53252; H01L 23/53266

See application file for complete search history.

(56) References Cited

U.S. PATENT DOCUMENTS 8,310,012 B2 11/2012 Hwang et al.
8,716,079 B2 5/2014 Heinrich et al.
(Continued)

*Primary Examiner* — Bryan Junge
(74) *Attorney, Agent, or Firm* — Haynes and Boone, LLP

(57) ABSTRACT

A semiconductor structure and a method for forming the same are provided. The semiconductor structure includes a gate stack structure formed over a substrate. The gate stack structure includes a gate electrode structure having a first portion and a second portion and a first conductive layer below the gate electrode structure. In addition, the first portion of the gate electrode structure is located over the second portion of the gate electrode structure, and a width of a top surface of the first portion of the gate electrode structure is greater than a width of a bottom surface of the second portion of the gate electrode structure.

20 Claims, 14 Drawing Sheets

(56) References Cited

U.S. PATENT DOCUMENTS

| | | |
|---|---|---|
| 8,735,236 B2 | 5/2014 | Hempel et al. |
| 8,951,855 B2 | 2/2015 | Lai et al. |
| 9,006,072 B2 | 4/2015 | Tsao et al. |
| 9,087,886 B2 | 7/2015 | Kim et al. |
| 9,275,995 B2 | 3/2016 | Kim et al. |
| 9,324,716 B2 | 4/2016 | Kim et al. |
| 9,385,069 B2 | 7/2016 | Liu et al. |
| 9,490,334 B2 | 11/2016 | Lu et al. |
| 2011/0101470 A1 | 5/2011 | Hempel et al. |
| 2012/0052641 A1 | 3/2012 | Lee et al. |
| 2012/0129331 A1* | 5/2012 | Choi ................ H01L 21/28088 438/592 |
| 2013/0099307 A1 | 4/2013 | Tseng et al. |
| 2013/0280900 A1* | 10/2013 | Lai ................ H01L 21/823842 438/589 |
| 2013/0320410 A1 | 12/2013 | Lin et al. |
| 2014/0248761 A1* | 9/2014 | Park ................ H01L 21/823871 438/586 |
| 2014/0299939 A1* | 10/2014 | Kim ................ H01L 21/02697 257/369 |
| 2015/0004783 A1* | 1/2015 | Lee ................ H01L 21/76843 438/653 |

\* cited by examiner

SEMICONDUCTOR STRUCTURE WITH ENLARGED GATE ELECTRODE STRUCTURE AND METHOD FOR FORMING THE SAME

PRIORITY DATA

The present application is a continuation application of U.S. patent application Ser. No. 14/927,842, filed Oct. 30, 2015, issuing as U.S. Pat. No. 9,748,350, entitled "SEMICONDUCTOR STRUCTURE WITH ENLARGED GATE ELECTRODE STRUCTURE AND METHOD FOR FORMING THE SAME", which is hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in a semiconductor structure is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
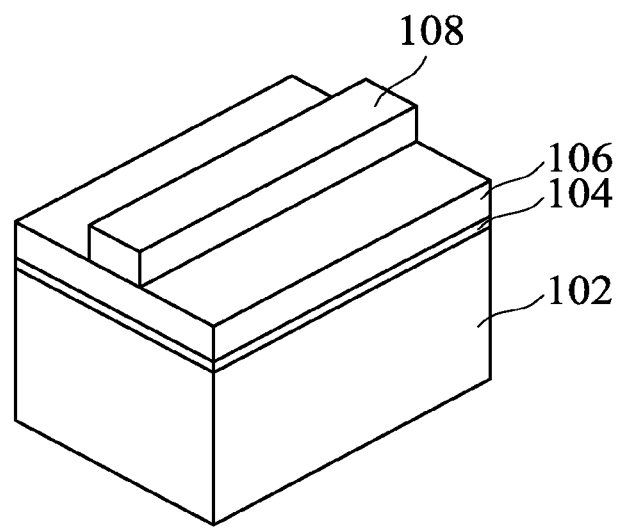
FIGS. 1A to 1P are perspective views of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The semiconductor structure may include a gate stack structure including a conductive layer and a gate electrode structure formed over the conductive layer. Before the gate electrode structure is formed, some portions of the conductive layer are etched back, so that the space for forming the gate electrode structure can be enlarged.

Figure 1B:
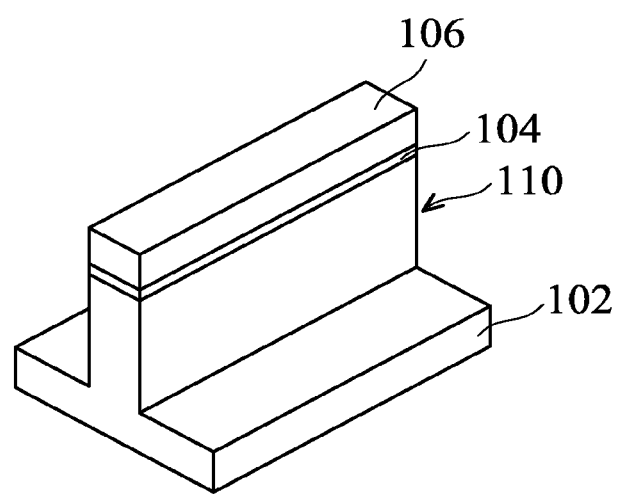
Figure 1C:
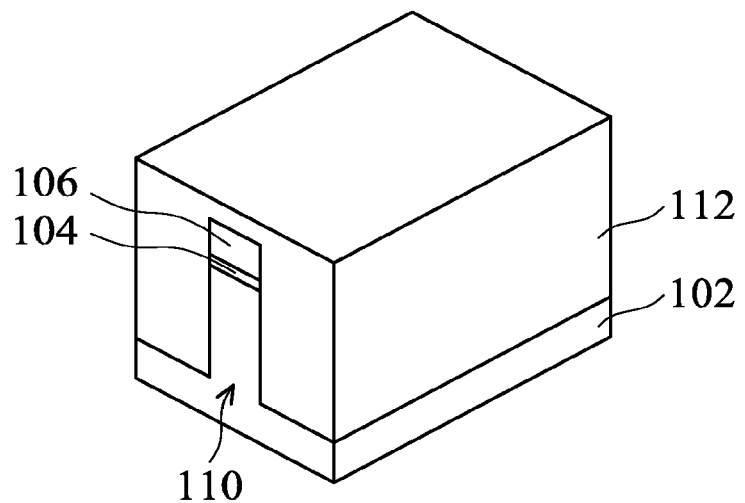
Figure 1D:
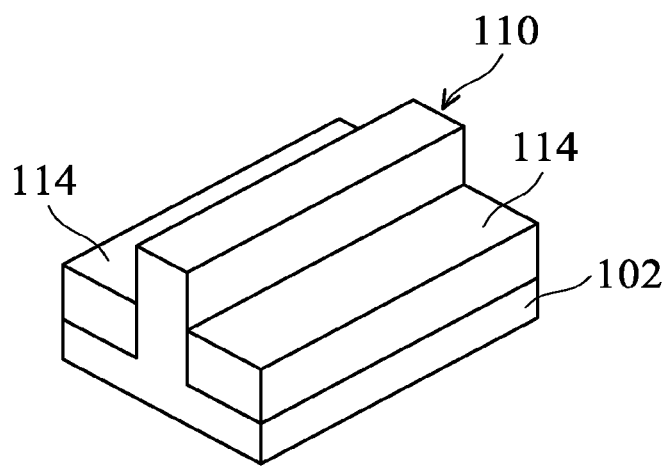
Figure 1E:
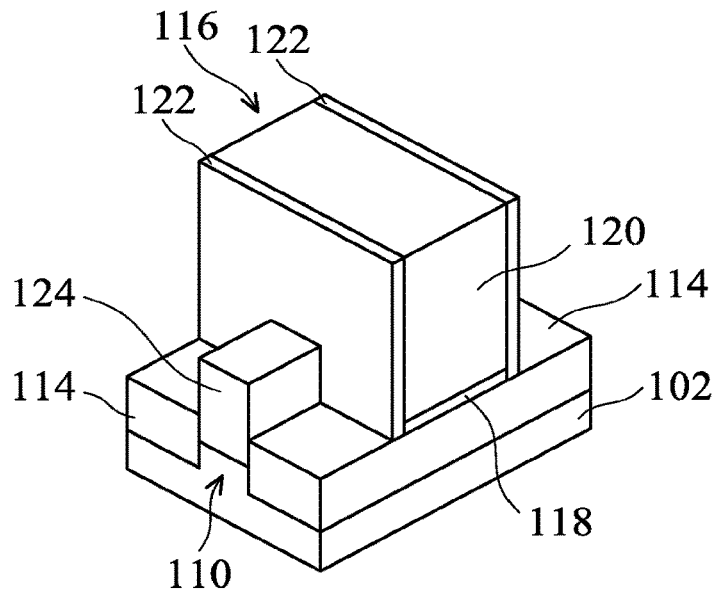
Figure 1F:
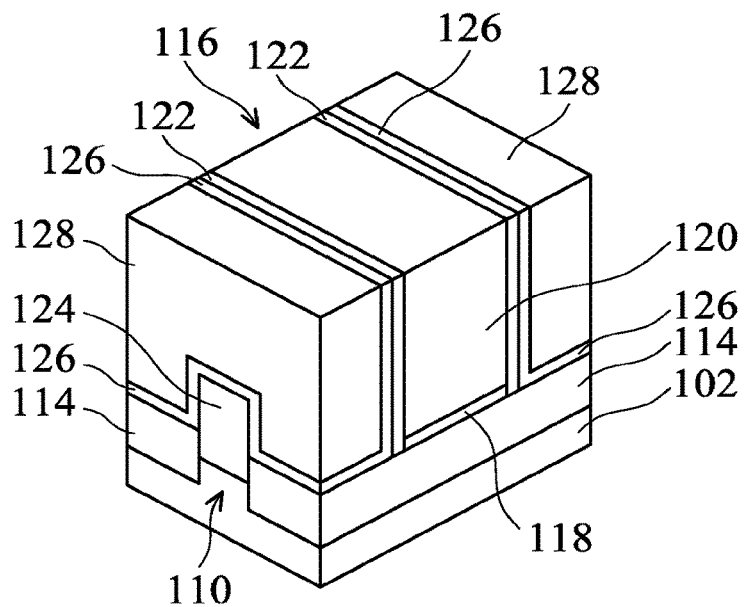
Figure 1G:
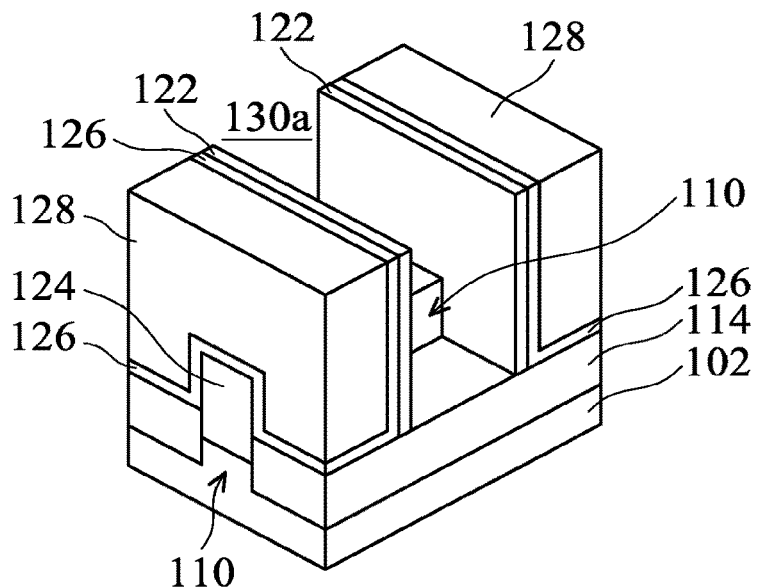
Figure 1H:
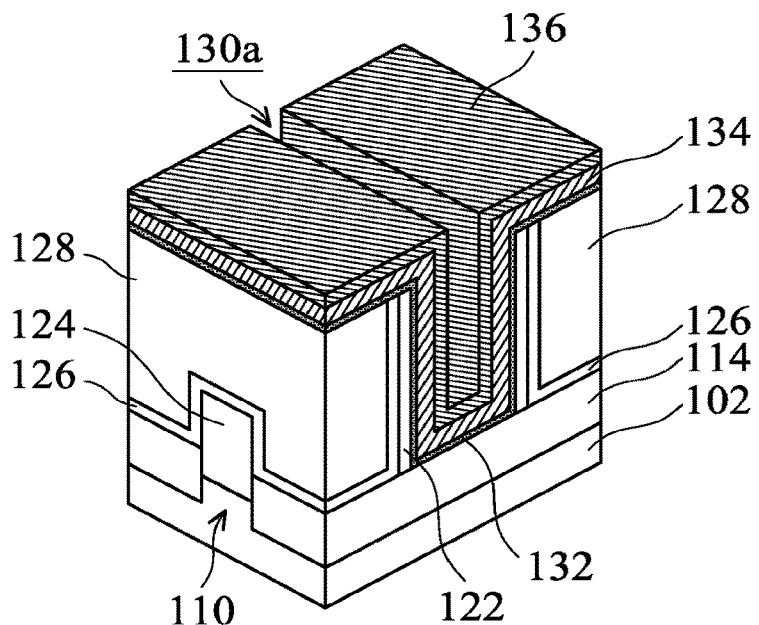
Figure 1I:
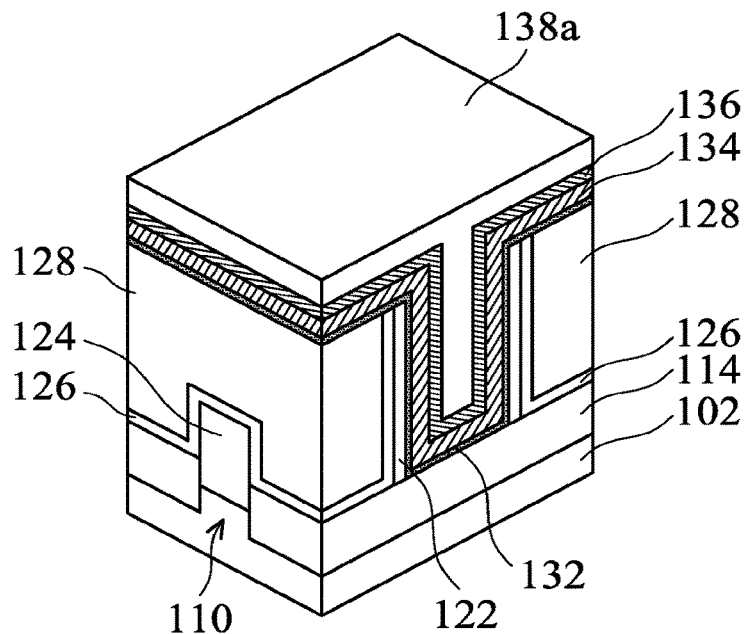
Figure 1J:
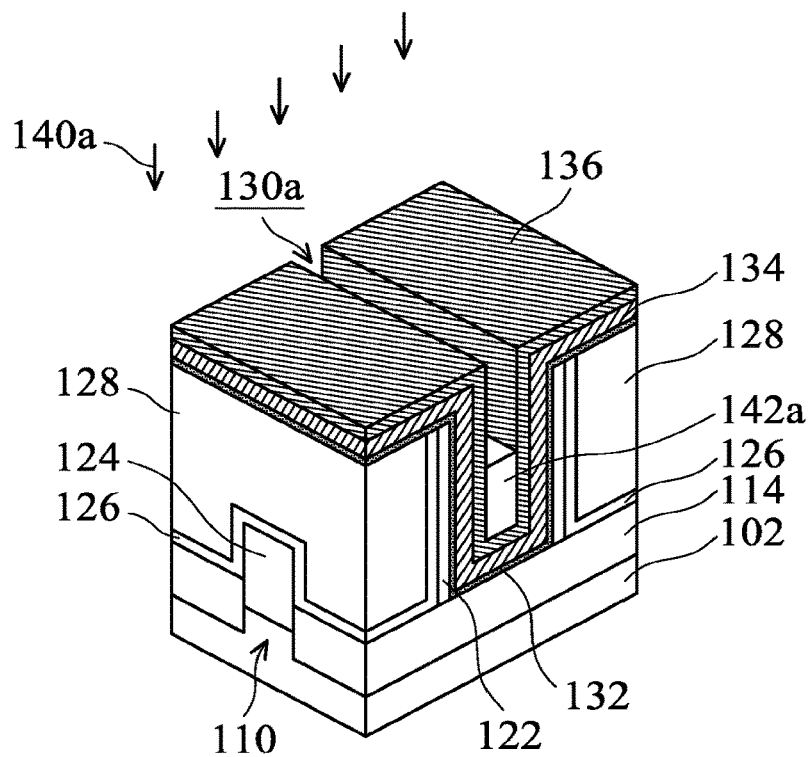
Figure 1K:
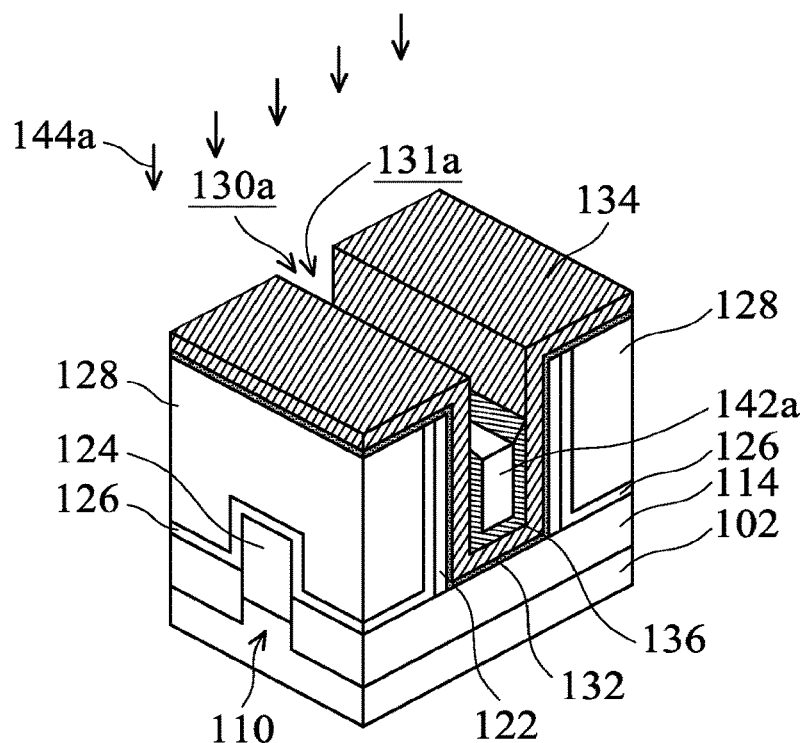
Figure 1L:
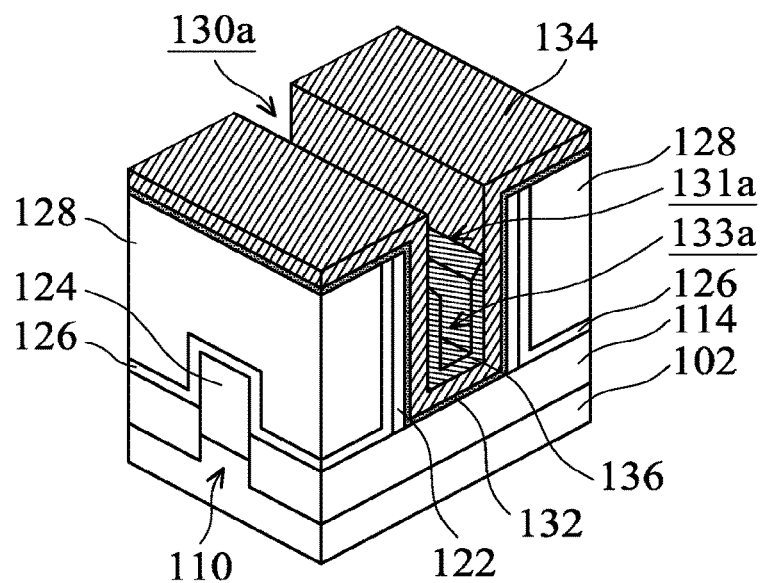
Figure 1M:
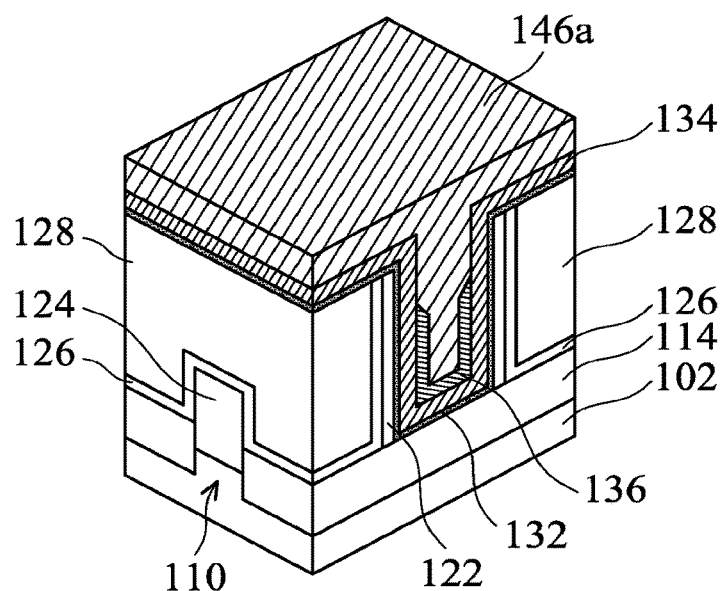
Figure 1N:
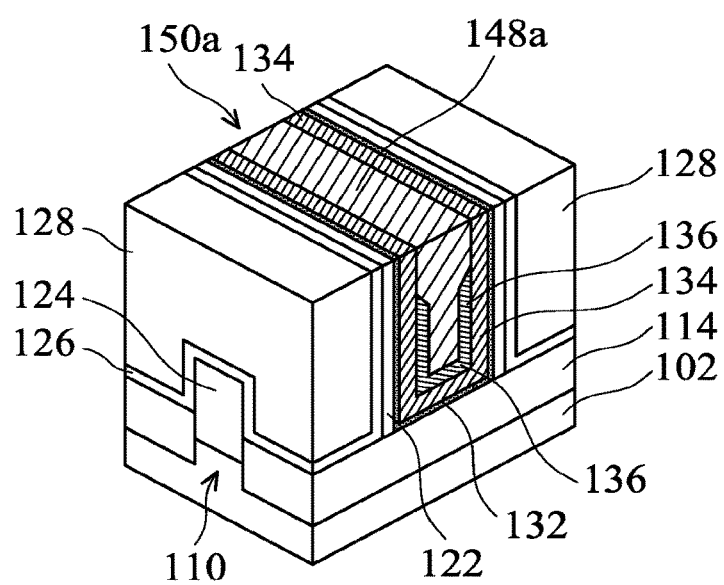
Figure 1O:
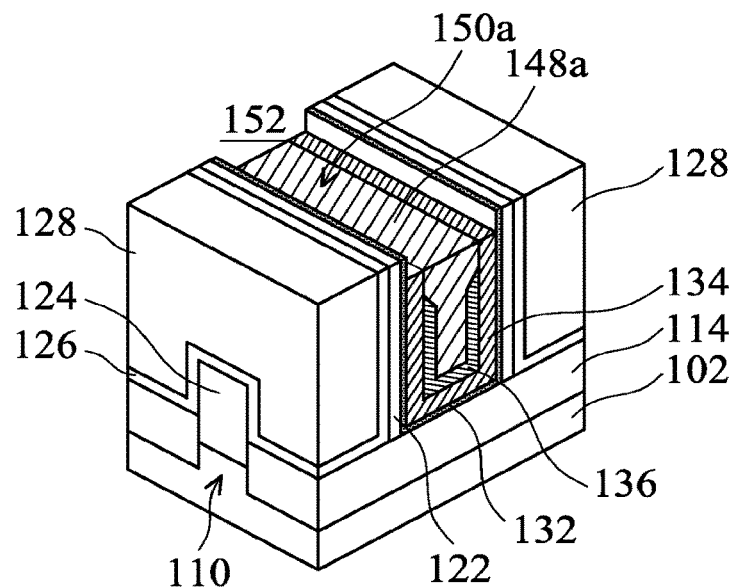
Figure 1P:
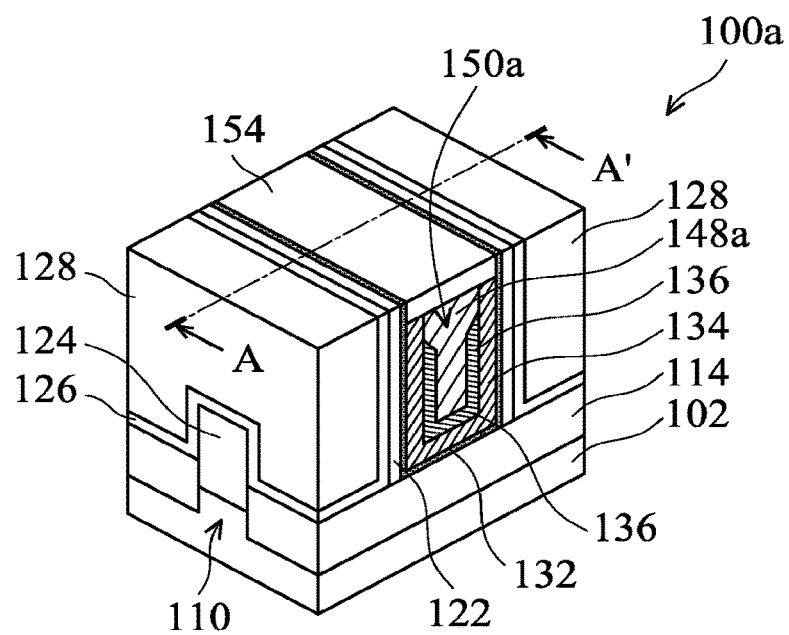

FIGS. 1A to 1P are perspective views of various stages of forming a semiconductor structure 100a in accordance with some embodiments. As shown in FIG. 1A, a substrate 102 is received in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A dielectric layer 104 and a mask layer 106 are formed over substrate 102, and a photo-sensitive layer 108 is formed over mask layer 104, as shown in FIG. 1A in accordance with some embodiments. Dielectric layer 104 may be used as an adhesion layer between substrate 102 and mask layer 106. In addition, dielectric layer 104 may also be used as an etch stop layer for etching mask layer 106. In some embodiments, dielectric layer 104 is made of silicon oxide. Dielectric layer 104 may be formed by using a thermal oxidation process, although other deposition processes may be used in some other embodiments.

Mask layer 106 may be used as a hard mask during subsequent photolithography processes. In some embodiments, mask layer 106 is made of silicon nitride. Mask layer 106 may be formed by using low-pressure chemical vapor deposition (LPCVD) or plasma enhanced chemical vapor deposition (PECVD), although other deposition processes may also be used in some other embodiments.

Next, a fin structure 110 is formed by sequentially etching mask layer 106, dielectric layer 104, and substrate 102 through photo-sensitive layer 108, as shown in FIG. 1B in accordance with some embodiments. Afterwards, photo-sensitive layer 108 is removed.

After fin structure 110 is formed, an insulating layer 112 is formed to cover fin structures 110 over substrate 102, as shown in FIG. 1C in accordance with some embodiments. In some embodiments, insulating layer 112 is made of silicon oxide, silicon nitride, silicon oxynitride, fluoride-doped silicate glass (FSG), or other low-K dielectric materials. Insulating layer 112 may be formed by using a high-density-plasma (HDP) CVD process, although other deposition processes may be used in other embodiments.

Next, insulating layer 112 is recessed to form an isolation structure 114, such as a shallow trench isolation structure, around fin structure 110, as shown in FIG. 1D in accordance with some embodiments. Insulating layer 112 may be recessed by a wet etching process or a dry etching process. In addition, mask layer 106 and dielectric layer 104 are removed.

Afterwards, a dummy gate structure 116 is formed across fin structure 110 and extends over isolation structure 114. In some embodiments, dummy gate structure 116 includes a dummy gate dielectric layer 118 and a dummy gate electrode layer 120 formed over dummy gate dielectric layer 118. In some embodiments, dummy gate dielectric layer 118 is made of silicon oxide. In some embodiments, dummy gate electrode layer 120 is made of poly silicon.

After dummy gate structure 116 is formed, spacers 122 are formed on the sidewalls of dummy gate structure 116 in accordance with some embodiments. In some embodiments, spacers 122 are made of silicon nitride, silicon oxide, silicon oxynitride, silicon carbide, or other applicable dielectric materials. Spacers 122 may include a single layer or multiple layers.

Next, source/drain structures 124 are formed in fin structure 110, as shown in FIG. 1E in accordance with some embodiments. In some embodiments, portions of fin structure 110 adjacent to dummy gate structure 116 are recessed to form recesses at two sides of fin structure 110, and a strained material is grown in the recesses by an epitaxial (epi) process to form source/drain structures 124. In addition, the lattice constant of the strained material may be different from the lattice constant of substrate 102. In some embodiments, source/drain structures 124 include Ge, SiGe, InAs, InGaAs, InSb, GaAs, GaSb, InAlP, InP, or the like.

After source/drain structures 124 are formed, a contact etch stop layer (CESL) 126 is formed over substrate 102, and an inter-layer dielectric (ILD) layer 128 is formed over contact etch stop layer 126, as shown in FIG. 1F in accordance with some embodiments. In some embodiments, contact etch stop layer 126 is made of silicon nitride, silicon oxynitride, and/or other applicable materials. Contact etch stop layer 126 may be formed by plasma enhanced CVD, low pressure CVD, ALD, or other applicable processes.

Inter-layer dielectric layer 128 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. Inter-layer dielectric layer 128 may be formed by chemical vapor deposition (CVD), physical vapor deposition, (PVD), atomic layer deposition (ALD), spin-on coating, or other applicable processes.

Next, a polishing process is performed on inter-layer dielectric layer 128 and contact etch stop layer 126 to expose the top surface of dummy gate structure 116 in accordance with some embodiments. In some embodiments, a chemical mechanical polishing (CMP) process is performed until the top surface of dummy gate structure 116 is exposed.

After the polishing process is performed, dummy gate structure 116 is removed, such that a trench 130a is formed, as shown in FIG. 1G in accordance with some embodiments. As shown in FIG. 1G, trench 130a is formed in interlayer dielectric layer 128 over substrate 102. In some embodiments, dummy gate structure 116 is removed by performing a dry etching process. In some embodiments, dummy gate structure 116 is removed by performing a dry etching process and a wet etching process. In order to miniaturize or shrink device sizes on a given substrate, the dummy gate may have a relatively small width. Therefore, the resulting trench 130a may also have a relatively small width. In some embodiments, trench 130a has a width in a range from about 10 nm to about 25 nm.

After dummy gate structure 116 is removed, a gate dielectric layer 132 is formed lining trench 130a, as shown in FIG. 1H in accordance with some embodiments. As shown in FIG. 1H, gate dielectric layer 132 is formed the sidewalls and the bottom surface of trench 130a. In some embodiments, gate dielectric layer 132 is made of silicon oxide. In some embodiments, gate dielectric layer 132 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

Afterwards, a conductive layer 134 is formed over gate dielectric layer 132, as shown in FIG. 1H in accordance with some embodiments. As shown in FIG. 1H, conductive layer 134 is formed over the sidewalls and the bottom of trench 130. In some embodiments, conductive layer 134 is a metal layer. In some embodiments, conductive layer 134 is made of a work function metal, which is configured to have a proper work function. In some embodiments, conductive layer 134 is made of $Ti_xN_y$, W, $Ti_xAl_y$, $Ti_xAl_yN$, $Ta_xAl_y$, $Ta_xAl_yN_z$, $Ti_xSi_yN_z$, $Ta_xSi_yN_z$, $Ta_xN_y$, $Hf_xO_y$, $Ti_xTa_yN_z$. In some embodiments, conductive layer 134 has a thickness in a range from about 1 Å to about 500 Å.

After conductive layer 134 is formed, another conductive layer 136 is formed over conductive layer 134, as shown in FIG. 1H in accordance with some embodiments. In some embodiments, conductive layer 134 and conductive layer 136 are made of different materials. In some embodiments, conductive layer 134 and conductive layer 136 are made of different materials which have relative high etching selectivity in a wet etching process.

In some embodiments, conductive layer 136 is a metal layer. In some embodiments, conductive layer 136 is made of a work function metal, which is configured to have a proper work function. In some embodiments, conductive layer 136 is made of $Ti_xN_y$, W, $Ti_xAl_y$, $Ti_xAl_yN$, $Ta_xAl_y$, $Ta_xAl_yN_z$, $Ti_xSi_yN_z$, $Ta_xSi_yN_z$, $Ta_xN_y$, $Hf_xO_y$, $Ti_xTa_yN_z$. In some embodiments, conductive layer 136 has a thickness in a range from about 1 Å to about 500 Å.

After conductive layers 134 and 136 are formed, a hard mask layer 138a is formed over conductive layer 136, as shown in FIG. 1I in accordance with some embodiments. As shown in FIG. 1I, trench 130a is filled with hard mask layer 138. In some embodiments, hard mask layer 138 is made of carbon-based materials, oxide based materials, silicon based materials, or combinations thereof.

Next, a first etching process 140a is performed on hard mask layer 138, as shown in FIG. 1J in accordance with some embodiments. In some embodiments, first etching process 140a is a dry etching process. During first etching process 140a, the portion of hard mask layer 138a positioned in the upper portion of trench 130a is removed, so that a blocking structure 142a is formed, as shown in FIG. 1J in accordance with some embodiments. After first etching process 140a, blocking structure 142a is formed in the lower portion of trench 130a, such that the portion of conductive layer 136 formed at the lower portion of trench 130a is covered by blocking structure 142a while the portion of conductive layer 136 formed at the upper portion 131a of trench 130a are exposed.

After blocking structure 142a is formed, the portion of conductive layer 136 which is not covered by blocking structure 142a is etched by a second etching process 144a, as shown in FIG. 1K in accordance with some embodiments. In some embodiments, second etching process 144a is a wet etching process. As described previously, conductive layers 134 and 136 are made of different materials. However, since conductive layers 134 and 136 are both made of conductive materials such as metals, they may have poor etching selectivity in a dry etching process. Therefore, a wet etching process is performed to remove the portion of conductive layer 136 not covered by blocking structure 142a, so that only a small amount of conductive layer 134 formed below conductive layer 136 will be etched during the wet etching process in accordance with some embodiments.

In addition, when conductive layer 136 is etched by performing second etching process 144, which is a wet etching process, conductive layer 136 has a sloped (inclined) top surface. The sloped top surface may enable the filling of gate electrode material become easier (Details will be described later.)

After second etching process 144a is performed, blocking structure 142a is removed to expose lower portion 133a of trench 130a, as shown in FIG. 1L in accordance with some embodiments. As shown in FIG. 1L, after blocking structure 142a is removed, trench 130a has a funnel shape with a wider upper portion 131a in a cross-sectional view.

Next, a gate electrode layer 146a is formed over substrate 102, as shown in FIG. 1M in accordance with some embodiments. More specifically, gate electrode layer 146a is formed over conductive layers 134 and 136, and upper portion 131a and lower portion 133a of trench 130a are both filled with gate electrode layer 146a. As described previously, since trench 130a has a wider upper portion and conductive layer 134 has the sloped top surface, it may be easier for gate electrode layer 146a to be formed in trench 130a. In some embodiments, gate electrode layer 146a is made of a conductive material, such as tungsten, aluminum, copper, titanium, tantulum, or other applicable materials.

After gate electrode layer 146a is formed, a polishing process is performed until the top surface of interlayer dielectric layer 128 is exposed, as shown in FIG. 1N in accordance with some embodiments. In some embodiments, the polishing process is a chemical mechanical polishing process. As shown in FIG. 1N, a gate electrode structure 148a is formed. Since gate electrode structure 148a is formed in trench 130a, gate electrode structure 148a also has a funnel shape in its cross-sectional view in accordance with some embodiments. In addition, conductive layer 134, conductive layer 136, and gate electrode structure 148a can be seen as a gate stack structure 150a.

Afterwards, an etching-back process is performed on gate stack structure 150a, as shown in FIG. 1O in accordance with some embodiments. During the etching-back process, the upper portion of gate electrode structure 148a and the upper portions of conductive layer 134 are etched. A recess 152 is formed after the etching-back process is performed. Next, a hard mask structure 154 is formed in trench 152, as shown in FIG. 1P in accordance with some embodiments. In some embodiments, hard mask structure 154 formed over gate stack structure 150 and is made of silicon nitride.

Figure 2:
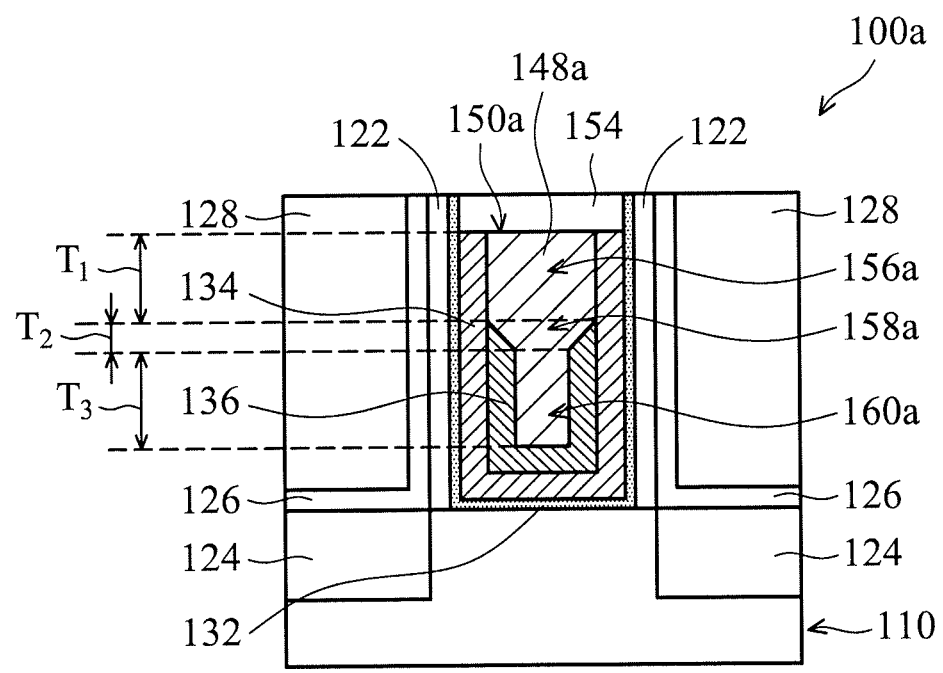
FIG. 2 is a cross-sectional representation of the semiconductor structure illustrated along line A-A' shown in FIG. 1P in accordance with some embodiments.

FIG. 2 is a cross-sectional representation of semiconductor structure 100a illustrated along line A-A' shown in FIG. 1P in accordance with some embodiments. As shown in FIG. 2, semiconductor structure 100a includes gate stack structure 150a formed across fin structure 110, and gate stack structure 150a includes conductive layer 134, conductive layer 136, and gate electrode structure 148a.

As described previously, dummy gate structure 116 (as shown in FIG. 1F) may have a relatively small width for device size shrinkage, and therefore gate stack structure 150a may also have a relatively small width. In some embodiments, gate stack structure 150a has a width in a range from about 10 nm to about 25 nm. However, although the width of gate stack structure 150a is relatively small, the size of gate electrode structure 148a can still be relatively large since second etching process 144a is performed to remove the upper portion of conductive layer 136 so that the space for forming gate electrode structure 148a is enlarged.

As shown in FIG. 2, gate electrode structure 148a has a funnel shape in its cross-sectional view in accordance with some embodiments. In addition, gate electrode structure 148a includes a first portion 156a, a second portion 158a, and a third portion 160a in accordance with some embodiments. First portion 156a is located over second portion 158a, and second portion 158a is located over third portion 160a. In some embodiments, second portion 158a has a trapezoid shape in its cross-sectional view.

As shown in FIG. 2, conductive layer 136 is formed around second portion 158a and third portion 160a but is not formed over the sidewalls of first portion 156a of gate electrode structure 148a in accordance with some embodiments. In addition, conductive layer 134 is located around conductive layer 136 and extends over the sidewalls of first portion 156a in accordance with some embodiments.

As described previously, second etching process 144a is performed, so that gate electrode structure 148a can have a wide upper portion (e.g. first portion 156a.) As shown in FIG. 2, the width of the top surface of gate electrode structure 148a (e.g. the width of the top surface of first portion 156a) is greater than the width of the bottom surface of gate electrode structure 148a (e.g. the width of the bottom surface of third portion 160a or the width of the bottom surface of second portion 158a) in accordance with some embodiments. In some embodiments, the width of the top surface of first portion 156a is greater than the width of the bottom surface of second portion 158a.

In some embodiments, the width of the top surface of gate electrode structure 148a is in a range from about 5 nm to about 300 nm. In some embodiments, the width of the bottom surface of gate electrode structure 148a is in a range from 1 Å to about 300 nm. As described previously, the upper portions of conductive layer 136 is removed, so the space for forming gate electrode structure 148e is enlarged and has a greater upper portion. Therefore, gate electrode structure 148e formed in the enlarged spacer also has the larger upper portion (e.g. first portion 156a), and the resistance of gate stack structure 150a may be reduced accordingly.

Furthermore, since second etching process 144a is performed, conductive layer 136 has the sloped top surface, which can also be seen as the sidewall of second portion 158a of gate electrode structure 148a. As shown in FIG. 2, the sidewall of first portion 156a has a first inclination, the sidewall of second portion 158a has a second inclination, and the sidewall of third portion 160a has a third inclination. The first inclination, the second inclination, and the third inclination are different from one another in accordance with some embodiments.

In some embodiments, an angle between the sidewall of first portion 156a and the sidewall of second portion 158a is in a range from about 95° to about 175°. In some embodiments, an angle between the sidewall of second portion 158a and the sidewall of third portion 160a is in a range from about 95° to about 175°. Gate electrode structure 148a is formed with such a shape, so that the filling of gate electrode layer 146a can be easier and the risk of forming gaps during the depositing process may be reduced.

In some embodiments, first portion 156a has a thickness $T_1$ in a range from about 0 nm to about 100 nm. In some embodiments, first portion 156a has a thickness $T_1$ in a range from about 2 nm to about 100 nm. In some embodiments, second portion 158a has a thickness $T_2$ in a range from about 2 nm to about 50 nm. In some embodiments, third portion 160a has a thickness $T_3$ in a range from about 2 nm to about 50 nm. By performing second etching process 144a, the size of gate electrode structure 148a may also be enlarged, and the resistance of the resulting gate stack structure 150a can be reduced.

Figure 3A:
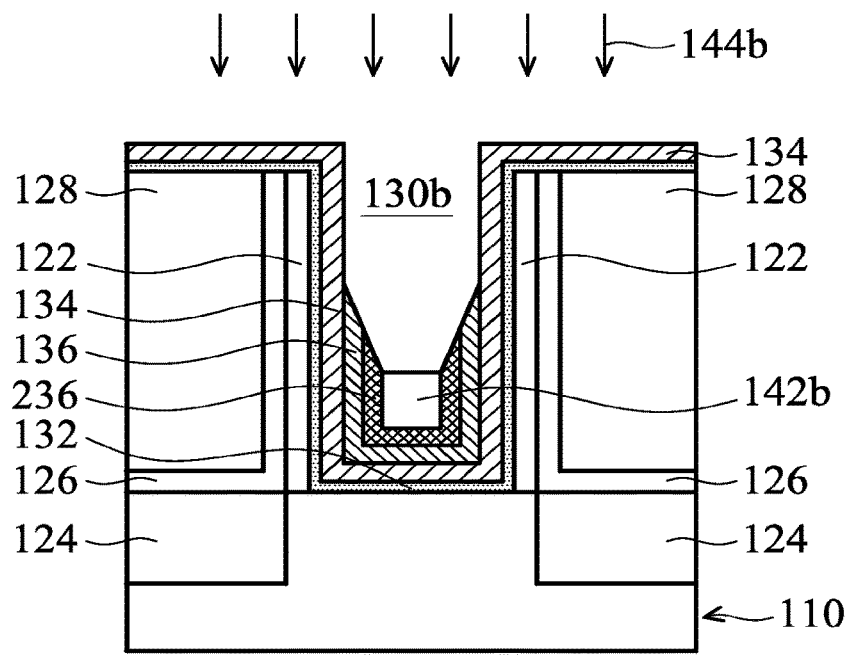
FIGS. 3A to 3B are cross-section representations of forming a semiconductor structure in accordance with some embodiments.
Figure 3B:
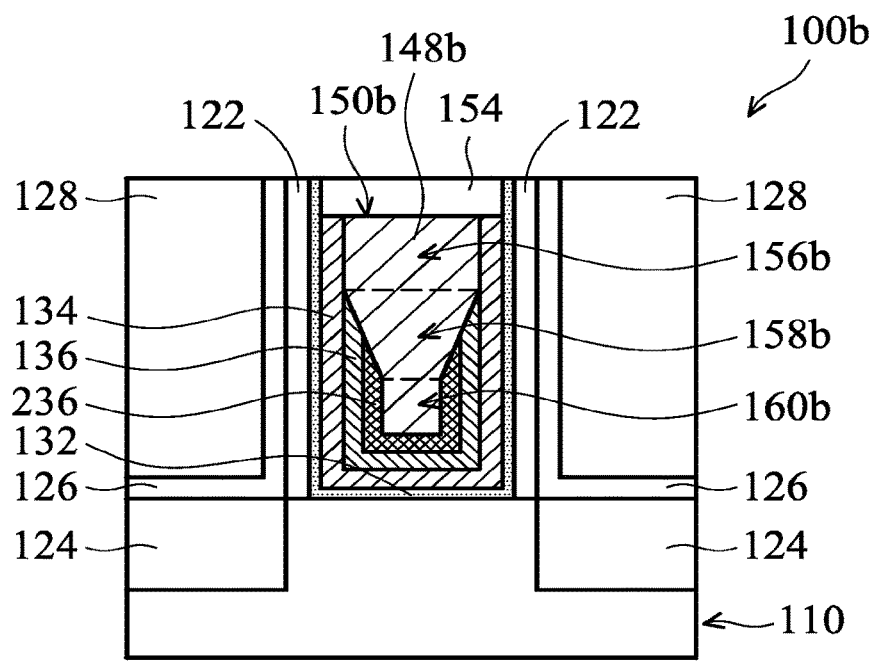

FIGS. 3A to 3B are cross-section representations of forming a semiconductor structure 100b in accordance with some embodiments. Semiconductor structure 100b is similar to semiconductor structure 100a, except an additional conductive layer is formed. Materials and processes used to form semiconductor structure 100b may be similar to, or the same as, those used to form semiconductor structure 100a described previously and are not repeated herein.

More specifically, processes shown in FIGS. 1A to 1H may be performed. After conductive layer 134 and conductive layer 136 are formed in the trench 130b, an additional conductive layer 236 is formed over conductive layer 136 in accordance with some embodiments. Next, a blocking structure 142b may be formed at a lower portion 133b of trench 130b, and a second etching process 144b may be performed. In some embodiments, second etching process 144b is a wet etching process. During second etching process 144b, conductive layer 236 and conductive layer 134 are both etched to enlarge the space for depositing a gate electrode layer later on. Afterwards, processes shown in FIGS. 1L to 1P may be performed to form semiconductor structure 100b.

As shown in FIG. 3B, semiconductor structure 100b includes a gate stack structure 150b formed across fin structure 110 over a substrate (e.g. substrate 102), and gate stack structure 150b includes conductive layer 134, conductive layer 136, conductive layer 236, and a gate electrode structure 148b. Gate electrode structure 148b includes a first portion 156b, a second portion 158b, and a third portion 160b. In addition, hard mask structure 154 is formed over gate stack structure 150b. In some embodiments, conductive layer 236 is made of $Ti_xN_y$, W, $Ti_xAl_y$, $Ti_xAl_yN$, $Ta_xAl_y$, $Ta_xAl_yN_z$, $Ti_xSi_yN_z$, $Ta_xSi_yN_z$, $Ta_xN_y$, $Hf_xO_y$, $Ti_xTa_yN_z$. In addition, conductive layers 134, 136, and 236 are made of different materials in accordance with some embodiments.

Since second etching process 144b is performed to conductive layer 136 and conductive layer 236, conductive layer 136 and conductive layer 236 may have sloped top surfaces, which may help the deposition of the gate electrode layer formed thereon. In addition, by performing second etching process 144b, the space for forming gate electrode structure 148b is enlarged, and therefore gate electrode structure 148b is enlarged. By forming gate stack structure 150b having larger gate electrode structure 148b, the resistance of gate stack structure 150b can be reduced, and the performance of semiconductor structure 100b may be improved.

Figure 4A:
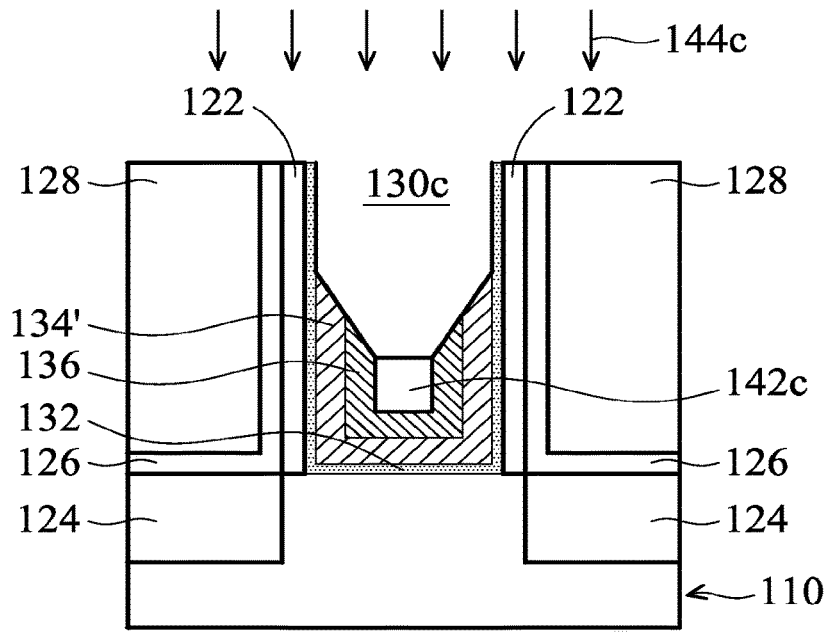
FIGS. 4A to 4B are cross-section representations of forming a semiconductor structure 100c in accordance with some embodiments.
Figure 4B:
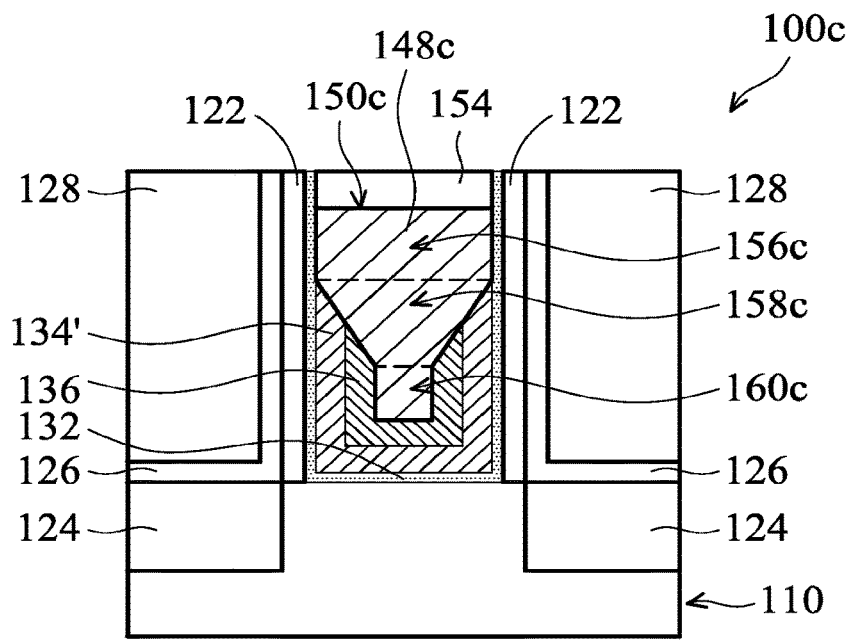

FIGS. 4A to 4B are cross-section representations of forming a semiconductor structure 100c in accordance with some embodiments. Semiconductor structure 100c is similar to semiconductor structure 100a, except both conductive layers are etched during the second etching process. Materials and processes used to form semiconductor structure 100c may be similar to, or the same as, those used to form semiconductor structure 100a described previously and are not repeated herein.

More specifically, processes shown in FIGS. 1A to 1J may be performed. After a blocking structure 142c is formed in the lower portion of a trench 130c over a conductive layer 134' and conductive layer 136, a second etching process 144c is performed in accordance with some embodiments. In some embodiments, conductive layer 134' is made of $Ti_xN_y$, W, $Ti_xAl_y$, $Ti_xAl_yN$, $Ta_xAl_y$, $Ta_xAl_yN_z$, $Ti_xSi_yN_z$, $Ta_xSi_yN_z$, $Ta_xN_y$, $Hf_xO_y$, $Ti_xTa_yN_z$. In addition, conductive layers 134' and 136 are made of different materials in accordance with some embodiments. During second etching process 144c, both conductive layer 134' and conductive layer 136 are etched. Afterwards, processes shown in FIGS. 1L to 1P may be performed.

As shown in FIG. 4B, semiconductor structure 100c includes a gate stack structure 150c formed across fin structure 110 over a substrate, and gate stack structure 150c includes conductive layer 134', conductive layer 136, and gate electrode structure 148c. Gate electrode structure 148c includes a first portion 156c, a second portion 158c, and a third portion 160c. In addition, hard mask structure 154 is formed over gate stack structure 150c.

Since second etching process 144c is performed to both conductive layer 134' and conductive layer 136, conductive layer 134' and conductive layer 136 may both have sloped top surfaces. The sloped top surface may help the deposition of the gate electrode layer formed thereon. In addition, by performing second etching process 144c, the space for forming gate electrode structure 148c is enlarged, and therefore gate electrode structure 148c formed in the space is enlarged. By forming gate stack structure 150c having larger gate electrode structure 148c, the resistance of gate stack structure 150c can be reduced, and the performance of semiconductor structure 100c may be improved.

Figure 5A:
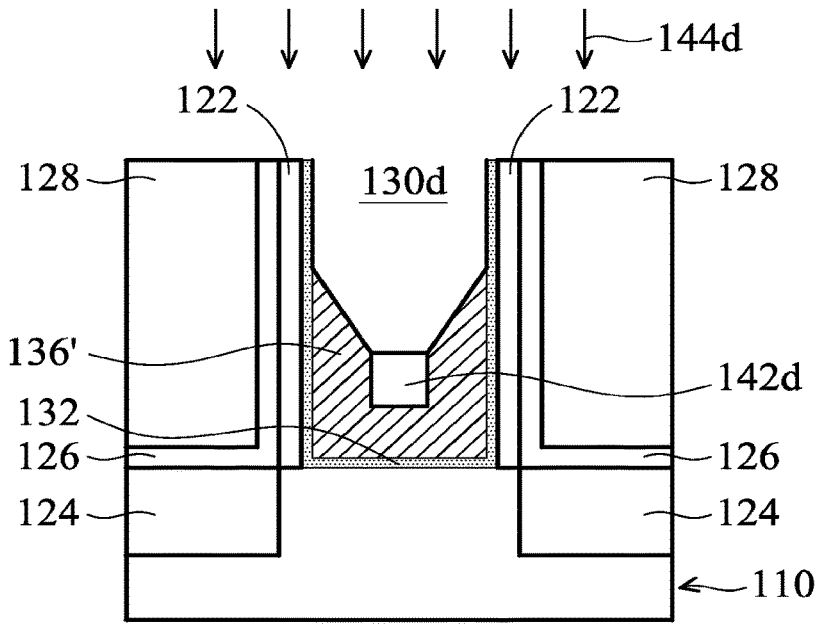
FIGS. 5A to 5B are cross-section representations of forming a semiconductor structure in accordance with some embodiments.
Figure 5B:
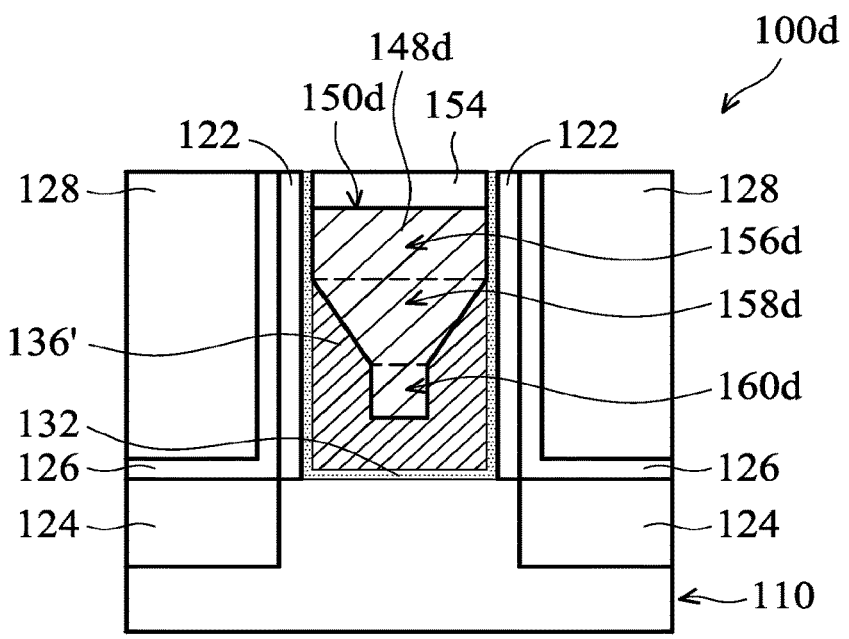

FIGS. 5A to 5B are cross-section representations of forming a semiconductor structure 100d in accordance with some embodiments. Semiconductor structure 100d is similar to semiconductor structure 100a, except only one conductive layer is formed. Materials and processes used to form semiconductor structure 100d may be similar to, or the same as, those used to form semiconductor structure 100a described previously and are not repeated herein.

More specifically, processes shown in FIGS. 1A to 1H may be performed. However, only one conductive layer 136' is formed in a trench 130d in accordance with some embodiments. In some embodiments, conductive layer 136' is made of $Ti_xN_y$, W, $Ti_xAl_y$, $Ti_xAl_yN$, $Ta_xAl_y$, $Ta_xAl_yN_z$, $Ti_xSi_yN_z$, $Ta_xSi_yN_z$, $Ta_xN_y$, $Hf_xO_y$, $Ti_xTa_yN_z$. After conductive layer 136' is formed, a blocking structure 142d is formed in the lower portion of trench 130d, and a second etching process 144d is performed to etch the upper portion of conductive layer 136'. After second etching process 144d is performed, process shown in FIGS. 1L to 1P may be performed.

As shown in FIG. 5B, semiconductor structure 100d includes a gate stack structure 150d formed across fin structure 110 over the substrate, and gate stack structure 150d includes conductive layer 136' and gate electrode structure 148d. In addition, hard mask structure 154 is formed over gate stack structure 150d.

Similarly, conductive layer 136' also has sloped top surfaces and enlarged gate electrode structure 148d, and therefore the resistance of gate stack structure 150d can be reduced, and the performance of semiconductor structure 100d may be improved.

FIGS. 6A to 6D are cross-sectional representations of various stages of forming a semiconductor structure 100e in accordance with some embodiments. Some materials and processes used to form semiconductor structure 100e may be similar to, or the same as, those used to form semiconductor structure 100a and are not repeated herein.

A structure similar to that shown in FIG. 4A may be formed, and the method to form the structure may be similar to, or the same as, those described previously. More specifically, a dummy gate structure is formed across fin structure 110 over a substrate, and spacers 122, contact etch stop layer 126, and interlayer dielectric layer 128 are formed around the dummy gate structure. Next, the dummy gate structure is removed to form a trench 130e between spacers 122, and a conductive layer 634 and a conductive layer 636 are formed over the bottom and the sidewalls of trench 130e. In some embodiments, conductive layer 634 and conductive layer 636 are individually made of $Ti_xN_y$, W, $Ti_xAl_y$, $Ti_xAl_yN$, $Ta_xAl_y$, $Ta_xAl_yN_z$, $Ti_xSi_yN_z$, $Ta_xSi_yN_z$, $Ta_xN_y$, $Hf_xO_y$, $Ti_xTa_yN_z$. In some embodiments, conductive layer 634 and conductive layer 636 are made of different materials.

Figure 6A:
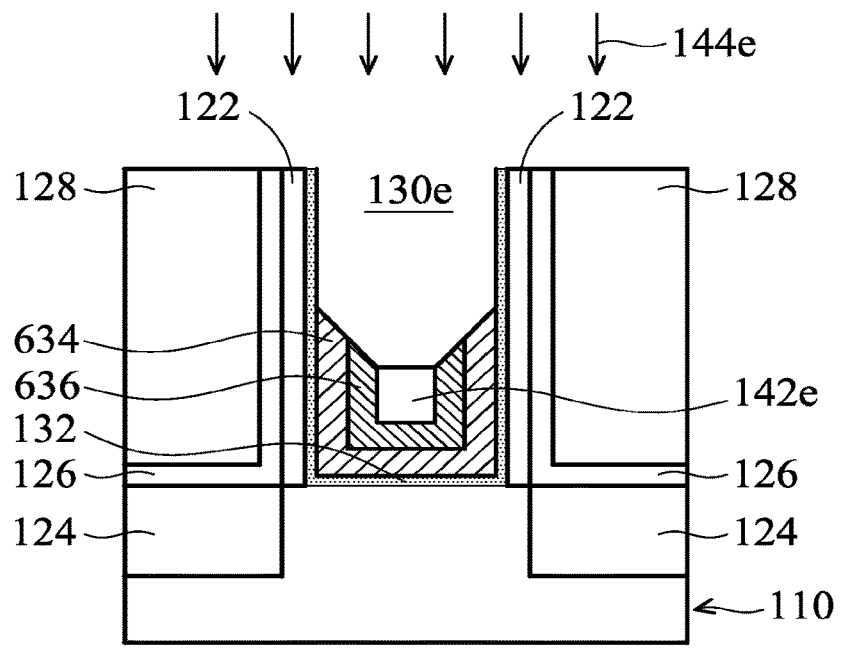
FIGS. 6A to 6D are cross-sectional representations of various stages of forming a semiconductor structure in accordance with some embodiments.

Afterwards, a blocking structure 142e is formed in the lower portion of trench 130e and a second etching process 144e is performed to etch conductive layer 634 and conductive layer 636. As shown in FIG. 6A, after second etching process 144e is performed, conductive layer 634 and conductive layer 636 have sloped top surfaces in accordance with some embodiments.

Figure 6B:
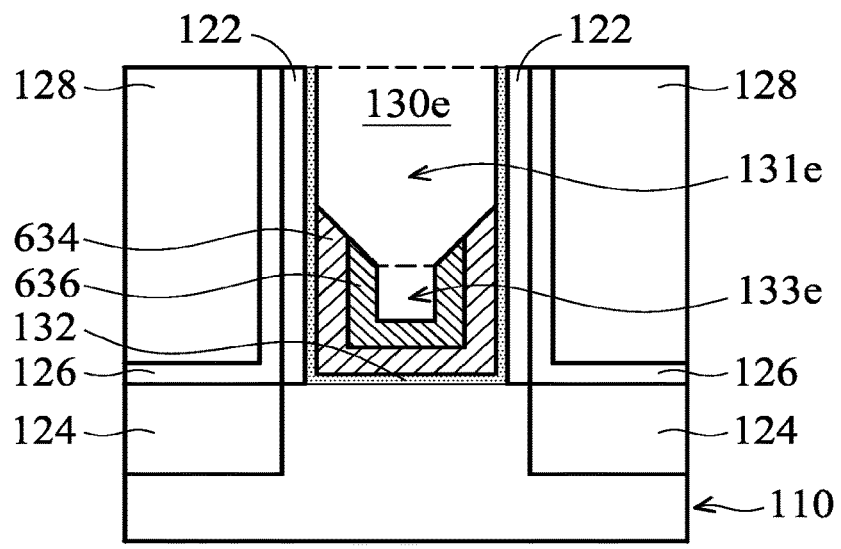
Figure 6C:
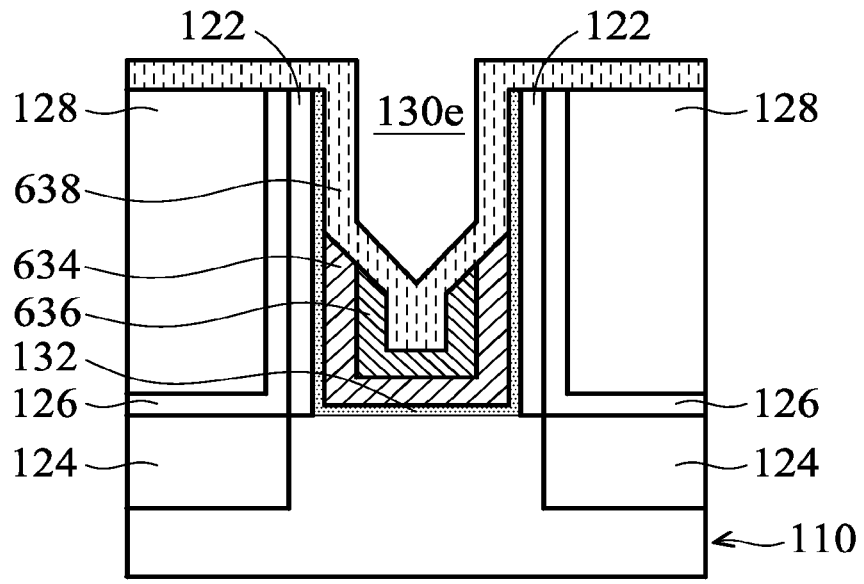

Next, block structure 142e is removed, and trench 130e now includes an upper region 130e and a lower portion 133e, as shown in FIG. 6B in accordance with some embodiments. As shown in FIG. 6B, lower portion 133e of trench 130e is surrounded by conductive layer 636. Afterwards, another conductive layer 638 is formed in trench 130e, as shown in FIG. 6C in accordance with some embodiments. In some embodiments, conductive layer 638 is made of $Ti_xN_y$, W, $Ti_xAl_y$, $Ti_xAl_yN$, $Ta_xAl_y$, $Ta_xAl_yN_z$, $Ti_xSi_yN_z$, $Ta_xSi_yN_z$, $Ta_xN_y$, $Hf_xO_y$, $Ti_xTa_yN_z$. In some embodiments, conductive layers 634, 636, and 638 are made of different materials.

More specifically, conductive layer 638 covers the upper portion of the sidewalls of trench 130e, the slopes top surfaces of conductive layer 634 and conductive layer 636, and the sidewalls of conductive layer 636. In some embodiments, lower portion 133e of trench 130e is fully filled with conductive layer 638. That is, conductive layer 638 has an extending portion surrounding by conductive layer 636 in accordance with some embodiments.

Figure 6D:
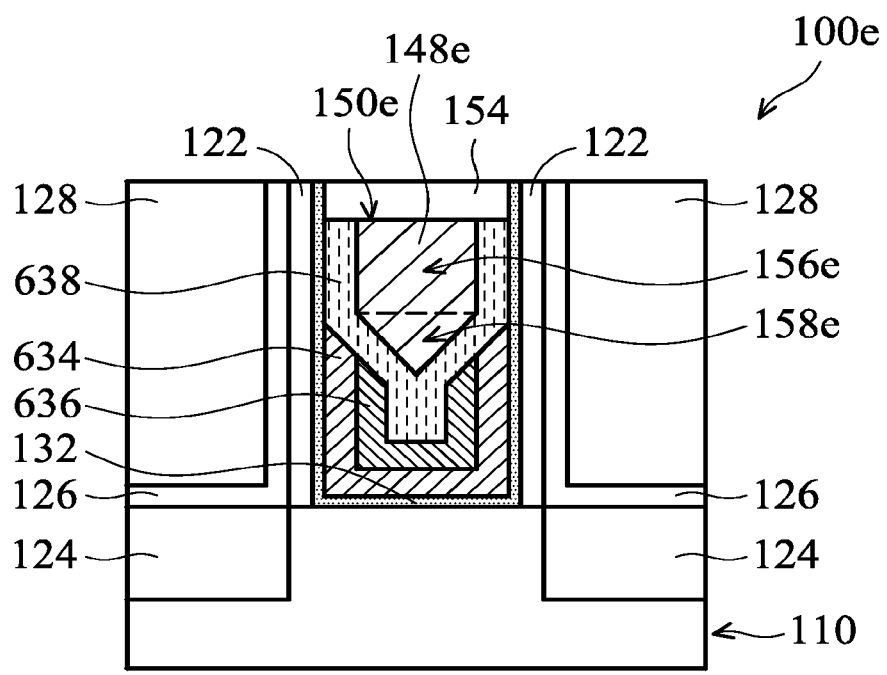

After conductive layer 638 is formed, processes similar to those shown in FIGS. 1M to 1P may be performed to form semiconductor structure 100e. As shown in FIG. 6D, semiconductor structure 100e includes a gate stack structure 150e formed across fin structure 110 over the substrate, and gate stack structure 150e includes conductive layer 346, conductive layer 636, conductive layer 638, and gate electrode structure 148e. Gate electrode structure 148e includes a first portion 156e and a second portion 158e. In addition, hard mask structure 154 is formed over gate stack structure 150e.

In some embodiments, second portion 158e has a tip bottom portion. In some embodiments, second portion 158e has a triangular shape in its cross-sectional view. As shown in FIG. 6D, conductive layer 638 is positioned between conductive layer 636 and gate electrode structure 148e and covers the sidewalls of first portion 156e and second portion 158e.

By performing second etching process 144e, the upper portion of conductive layer 634 and conductive layer 636 are removed. Therefore, after conductive layer 638 is formed, upper portion 131e of trench 130e can still have enough space for forming gate electrode structure 148e, although lower portion 133e of trench 130e is filled with conductive layer 638. Accordingly, even if the width of gate stack structure 150e is relatively narrow, a number of conductive layers may still be formed in lower portion 131e of trench and there will still be enough space for gate electrode structure 148e to be formed.

It should be noted that although some structures shown in the figures and described previously are divided into several portions, they are drawn and described for better understanding the concept of the disclosure. However, there may not be actual boundaries or interfaces between them. In addition, in various embodiments, a gate stack structure may include one or more conductive layers, and the scope of the disclosure is not intended to be limiting.

As described previously, a gate stack structure (e.g. gate stack structure 150a to 150e) includes a conductive layer (e.g. conductive layers 134, 136, 236, 134', 136', 634, 636, and 638) and a gate electrode structure (e.g. gate electrode structures 148a to 148e) formed over the conductive layer in accordance with some embodiments. In addition, before the gate electrode structure is formed, an etching process (e.g. second etching processes 144a to 144e) is performed, so that the space for forming the gate electrode layer is enlarged. Therefore, the gate stack structure can have a larger gate electrode structure, such as made of tungsten, and therefore the resistance of the gate stack structure can be reduced.

In addition, a hard mask layer (e.g. hard mask layer 154) is formed over the gate stack structure in accordance with some embodiments. Since the etching process is performed to enlarge the space of the upper portion of the gate stack structure, there also is enough space for forming the hard mask layer. Therefore, the risk for forming short circuit due to thin hard mask layer can be reduced. In addition, even if the hard mask layer is formed, the remaining gate electrode structure can still have a sufficient size, and the performance of the gate stack structure may be improved.

Furthermore, in some embodiments, the etching process is a wet etching process. When several conductive layers are formed, the wet etching process may have a better etching selectively towards each conductive layer. In addition, after the etching process, the conductive layer may have a sloped top surface, which may help the forming of the gate electrode layer (e.g. gate electrode layer 146a) formed over it. Moreover, by performing the wet etching process, the risks of shortening the gate stack height due to etching may also be reduced.

Embodiments of a semiconductor structure and methods for forming the semiconductor structures are provided. The semiconductor structure includes a gate stack structure. The gate stack structure includes a gate electrode structure and a conductive layer formed below the gate electrode structure. The gate electrode structure includes a wide upper portion and a narrow lower portion, so that the resistance of the gate stack structure may be reduced. Therefore, the performance of the gate stack structure may be improved.

In some embodiments, a semiconductor structure is provided. The semiconductor structure includes a gate stack structure formed over a substrate. The gate stack structure includes a gate electrode structure having a first portion and a second portion and a first conductive layer below the gate electrode structure. In addition, the first portion of the gate electrode structure is located over the second portion of the gate electrode structure, and a width of a top surface of the first portion of the gate electrode structure is greater than a width of a bottom surface of the second portion of the gate electrode structure.

In some embodiments, a semiconductor structure is provided. The semiconductor structure includes a fin structure formed over a substrate and a gate stack structure formed across the fin structure. the gate stack structure includes a gate electrode structure having a first portion, a second portion located below the first portion, and a third portion located below the second portion and a first conductive layer formed around the second portion and the third portion of the gate electrode structure. In addition, a width of a top surface of the first portion of the gate electrode layer is greater than a width of a bottom surface of the third portion of the gate electrode layer.

In some embodiments, a method for manufacturing a semiconductor structure is provided. The method for manufacturing a semiconductor structure includes forming a trench over a substrate and forming a first conductive layer on sidewalls and a bottom of the trench. The method for manufacturing a semiconductor structure further includes forming a hard mask layer over the first conductive layer and etching the hard mask layer to form a blocking structure in a lower portion of the trench by performing a first etching process. The method for manufacturing a semiconductor structure further includes etching a portion of the first conductive layer not covered by the blocking structure by performing a second etching process and removing the blocking structure. The method for manufacturing a semiconductor structure further includes filling the trench by a gate electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    defining a trench over a substrate;
    forming a first conductive gate layer on sidewalls and a bottom of the trench;
    forming a mask layer over the first conductive gate layer;
    performing a first etching process including etching the mask layer to form a blocking structure in a lower portion of the trench;
    etching a portion of the first conductive gate layer not covered by the blocking structure by performing a second etching process to form an etched portion of the first conductive gate layer, wherein a sloped top surface of the etched portion extends from a top surface of the blocking structure upwards to an underlying layer disposed under the first conductive gate layer in the trench;
    removing the blocking structure; and
    after removing the blocking structure, forming a conductive material in the trench over the etched portion of the first conductive gate layer.

2. The method for manufacturing a semiconductor structure as claimed in claim 1, wherein the second etching process is a wet etching process.

3. The method for manufacturing a semiconductor structure as claimed in claim 1, wherein the first etching process is a dry etching process.

4. The method for manufacturing a semiconductor structure as claimed in claim 1, further comprising
    forming a second conductive gate layer before the first conductive gate layer is formed,
    wherein the second conductive gate layer is not etched during the second etching process.

5. The method for manufacturing a semiconductor structure as claimed in claim 1, further comprising
    forming a second conductive gate layer over the first conductive gate layer after the blocking structure is removed,
    wherein the conductive material is formed over the second conductive gate layer.

6. The method for manufacturing a semiconductor structure as claimed in claim 1, wherein the conductive material forms a structure having a first portion and a second portion located below the first portion, and a width of a top surface of the first portion of the structure is greater than a width of a bottom surface of the second portion of the structure.

7. The method for manufacturing a semiconductor structure as claimed in claim 1, wherein defining the trench comprises:
    forming a fin structure over the substrate;
    forming a dummy gate structure across the fin structure;
    forming spacers on sidewalls of the dummy gate structure; and
    removing the dummy gate structure to form the trench.

8. A method for manufacturing a semiconductor structure, comprising:
    forming a trench over a substrate;
    forming a gate dielectric layer on sidewalls and a bottom of the trench;

forming a plurality of conductive layers over the gate dielectric layer on the sidewalls and the bottom of the trench;

forming a blocking structure in a lower portion of the trench over the plurality of conductive layers;

etching a portion of each of the plurality of conductive layers not covered by the blocking structure, wherein the etching forms a sloped top surface of each of the plurality of conductive layers, wherein the sloped top surface extends from a termination point level with and interfacing a top surface of the blocking structure upwards towards another termination point closer a nearest sidewall of the trench;

after the etching, removing the blocking structure; and after removing the blocking structure, depositing at least one additional conductive gate layer over the etched plurality of conductive layers.

9. The method for manufacturing a semiconductor structure as claimed in claim 8, wherein the etching the portion of each of the plurality of conductive layers includes performing a wet etching process.

10. The method for manufacturing a semiconductor structure as claimed in claim 8, wherein the at least one additional conductive gate layer includes a first width at a top portion and a second width at a bottom portion, the first width greater than the second width.

11. The method for manufacturing a semiconductor structure as claimed in claim 8, wherein the at least one additional conductive gate layer has a funnel shape in its cross-sectional view.

12. The method for manufacturing a semiconductor structure as claimed in claim 8, wherein the gate dielectric layer extends along an entirety of each of the sidewalls of the trench after the etching the portion of each of the plurality of conductive layers.

13. A method for manufacturing a semiconductor structure, comprising:

forming a fin structure extending from a semiconductor substrate;

forming an interlayer dielectric layer over the fin structure;

defining an opening in the interlayer dielectric layer; and forming a gate stack over the fin structure in the opening, wherein the forming the gate stack includes:

depositing a gate dielectric layer over the fin structure and in the opening;

depositing a first conductive layer over the gate dielectric layer in the opening;

forming a blocking structure in the opening over the fin structure;

while using the blocking structure to mask a portion of the first conductive layer, etching a top portion of the first conductive layer within the opening, wherein the etching forms a sloped top surface of the first conductive layer within the opening, the sloped top surface extending from an end level with a top surface of the blocking structure; and depositing a conductive layer over a remaining portion of the first conductive layer after the etching the top portion.

14. The method of claim 13, wherein the forming the blocking structure includes depositing a masking layer in the opening and on a top surface of the interlayer dielectric layer, and etching back the masking layer to form the blocking structure.

15. The method of claim 13, wherein the depositing the conductive layer forms the conductive layer in direct contact with the sloped top surface.

16. The method of claim 13, further comprising:
after depositing the conductive layer, etching back the conductive layer to form a second opening.

17. The method of claim 16, further comprising:
depositing a hard mask layer in the second opening, wherein a top surface of the hard mask layer is coplanar with a top surface of the interlayer dielectric layer.

18. The method of claim 16, wherein the gate dielectric layer remains on entirety of a sidewall of the opening after the etching back the conductive layer.

19. The method of claim 13, wherein the etching the top portion of the first conductive layer is a wet etching process.

20. The method of claim 13, further comprising:
depositing a second conductive layer under the first conductive layer in the opening and on a top surface of the interlayer dielectric layer; and wherein the second conductive layer remains on the top surface of the interlayer dielectric layer during the etching the top portion of the first conductive layer.

* * * * *